US009490551B2

(12) United States Patent
Hirooka et al.

(10) Patent No.: US 9,490,551 B2
(45) Date of Patent: Nov. 8, 2016

(54) FITTING EQUIPPED ELECTRICALLY CONDUCTIVE SHEET

(71) Applicants: AUTONETWORKS TECHNOLOGIES, LTD., Yokkaichi, Mie (JP); SUMITOMO WIRING SYSTEMS, LIMITED, Yokkaichi, Mie (JP); SUMITOMO ELECTRIC INDUSTRIES, LTD., Osaka-shi, Osaka (JP)

(72) Inventors: Toshiya Hirooka, Yokkaichi (JP); Kouji Fukumoto, Yokkaichi (JP); Daisuke Hashimoto, Yokkaichi (JP); Jison Kimu, Yokkaichi (JP); Hiroyuki Matsuoka, Yokkaichi (JP); Takuya Tate, Yokkaichi (JP); Masamichi Yamagiwa, Yokkaichi (JP); Akihide Kondo, Yokkaichi (JP); Shigeru Ogihara, Yokkaichi (JP)

(73) Assignees: AUTONETWORKS TECHNOLOGIES, LTD., Mie (JP); SUMITOMO WIRING SYSTEMS, LIMITED, Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/911,616

(22) PCT Filed: Jul. 22, 2014

(86) PCT No.: PCT/JP2014/069271
§ 371 (c)(1),
(2) Date: Feb. 11, 2016

(87) PCT Pub. No.: WO2015/022840
PCT Pub. Date: Feb. 19, 2015

(65) Prior Publication Data
US 2016/0190712 A1    Jun. 30, 2016

(30) Foreign Application Priority Data

Aug. 12, 2013  (JP) .................................. 2013-167253
Dec. 24, 2013  (JP) .................................. 2013-265767

(51) Int. Cl.
H01R 3/00    (2006.01)
H01R 4/20    (2006.01)
H01R 4/18    (2006.01)
H01R 4/64    (2006.01)
H01R 9/03    (2006.01)

(52) U.S. Cl.
CPC ................ H01R 4/20 (2013.01); H01R 4/182 (2013.01); H01R 4/646 (2013.01); H01R 9/034 (2013.01); *H01R 2201/26* (2013.01)

(58) Field of Classification Search
CPC .... H01R 4/20; H01R 2201/26; H01R 4/182; H01R 4/646; H01R 9/034; H01R 12/55; H01R 12/52; H01R 12/716; H01R 12/707
See application file for complete search history.

(56) References Cited

U.S. PATENT DOCUMENTS

| 8,529,276 B2 * | 9/2013 | Esquivel .............. H01R 12/716 |
| | | 439/492 |
| 9,077,102 B2 * | 7/2015 | Miyazaki ............. H01R 12/707 |
| 2013/0330963 A1 * | 12/2013 | Miura .................. H01R 12/777 |
| | | 439/492 |

FOREIGN PATENT DOCUMENTS

JP    H05-87820 U    11/1993
(Continued)

OTHER PUBLICATIONS

Aug. 19, 2014 International Search Report issued in International Patent Application No. PCT/JP2014/069271.

*Primary Examiner* — Jean F Duverne
(74) *Attorney, Agent, or Firm* — Oliff PLC

(57) ABSTRACT

A fitting-equipped electrically conductive sheet and a connection fitting configured to electrically connect to another member, in which both a low connection resistance and a high fixing strength are easily achieved. The connection fitting has a crimp section that is crimped to an edge section of the electrically conductive sheet material. The crimp section includes a pair of plate-shaped holding sections between which the edge section of the sheet material is sandwiched, and a folded-back section that connects them. One of the pair of plate-shaped holding sections has a band-shaped recess on an outer surface of an intermediate region between the folded-back section and the opposite edge section, the band-shaped recess being band-shaped by being more strongly crimped to the sheet material than other parts.

14 Claims, 9 Drawing Sheets

(56) References Cited

FOREIGN PATENT DOCUMENTS

| JP | H08-153561 A | 6/1996 |
| JP | 3621913 B2 | 2/2005 |
| JP | 2003-344398 A | 12/2006 |
| JP | 2008-041332 A | 2/2008 |

* cited by examiner

FITTING EQUIPPED ELECTRICALLY CONDUCTIVE SHEET

TECHNICAL FIELD

Preferred embodiments relate to a fitting-equipped electrically conductive sheet that is provided with an electrically conductive sheet material, and a connection fitting for electrically connecting the sheet material and another member.

BACKGROUND ART

As disclosed in Patent Document 1, braided wires are conventionally used as shield members that are deformable in accordance with deformation of electric wires. A braided wire has a structure in which metallic yarn is braided into a tubular shape.

In Patent Document 1, an end of the tubular braided wire covers a tubular section of a shield shell auxiliary section made of metal, and is fixed to the tubular section by a ring-shaped fixing member. That is, the end of the braided wire is fixed to the tubular section by being sandwiched between the tubular section and the fixing member.

Furthermore, the shield shell auxiliary section is electrically connected to a metal housing via another metal member. Moreover, the electric wires inserted through the braided wire are laid in the inside of the housing via an opening of the housing.

The shield shell auxiliary section and the ring-shaped fixing member of Patent Document 1 are examples of connection fittings for electrically connecting the braided wire and another member.

CITATION LIST

Patent Document

Patent Document 1: JP 2006-344398A

SUMMARY

Meanwhile, there is the demand for use of an electrically conductive sheet material such as metal cloth or metal foil as a current transmitting mediums in vehicles such as automobiles. For example, it is conceivable that metal cloth is used in place of a braided wire as a shield member. In this case, the metal cloth is used in a state of being held in the shape of a tube surrounding electric wires. The metal cloth has a mesh structure in which metallic yarn is crossed and woven.

If the electrically conductive sheet material is used as a current transmitting medium, a connection fitting will be needed for electrically connecting the sheet material and another conductor such as a reference potential body. Hereinafter, an electric component that includes an electrically conductive sheet material and a connection fitting connected to this sheet material is referred to as a "fitting-equipped electrically conductive sheet".

In fitting-equipped electrically conductive sheets, it is essential that the fixing strength of the connection fitting to the sheet material is sufficiently high, and the connection resistance between the sheet material and the connection fitting is sufficiently low.

Note that "fixing strength" refers to a force that is needed for separating the connection fitting from the sheet material when a force is being applied to the sheet material in a direction of drawing the sheet material from that part of the connection fitting that is connected to the sheet material. Furthermore, "connection resistance" refers to an electric resistance between the electrically conductive sheet material and the connection fitting.

However, when the shield shell auxiliary section and the ring-shaped fixing member that are disclosed in Patent Document 1 are used as the connection fittings that are connected to the sheet material such as metal cloth, it is difficult to achieve both a low connection resistance and a high fixing strength.

In other words, if the holding force of the two metal members that sandwich the sheet material is too large, the sheet material will be compressed excessively, and thus it is not possible to ensure a sufficient fixing strength. On the other hand, if the holding force of the two metal members that sandwich the sheet material is controlled to be reduced to the extent that a sufficient fixing strength can be ensured, the connection resistance between the two metal members and the sheet material will increase.

It is an object of preferred embodiments to realize a fitting-equipped electrically conductive sheet that is provided with an electrically conductive sheet material, and a connection fitting that electrically connects this sheet material and another member, in which both a low connection resistance and a high fixing strength are easily achieved.

A fitting-equipped electrically conductive sheet according to a first aspect includes the following constituent components:

(1) a first constituent component is an electrically conductive sheet material; and
(2) a second constituent component is a connection fitting for electrically connecting the sheet material and another member, the connection fitting including a crimp section that is crimped to an edge section of the sheet material. The crimp section is a section that is formed by a plate-shaped section being folded back. The crimp section includes a pair of plate-shaped holding sections between which the edge section of the sheet material is sandwiched, and a folded-back section that connects the pair of plate-shaped holding sections. At least one of the pair of plate-shaped holding sections has a band-shaped recess on an outer surface of an intermediate region between the folded-back section and an opposite edge section of the plate-shaped holding section, the band-shaped recess being band-shaped by being more strongly crimped to the sheet material than other parts.

A fitting-equipped electrically conductive sheet according to a second aspect relates to the fitting-equipped electrically conductive sheet according to the first aspect. In the fitting-equipped electrically conductive sheet according to the second aspect, a surface of the band-shaped recess includes a band-shaped inclined surface that extends in a longitudinal direction of the band-shaped recess. The band-shaped inclined surface is a surface that is formed so as to become gradually deeper from an end of the band-shaped recess in a width direction toward a position closer to the center.

A fitting-equipped electrically conductive sheet according to a third aspect relates to the fitting-equipped electrically conductive sheet according to the second aspect. In the fitting-equipped electrically conductive sheet according to the third aspect, the surface of the band-shaped recess further includes a band-shaped flat surface that extends in the longitudinal direction of the band-shaped recess. The band-shaped flat surface is a surface that is formed at a constant depth between a pair of band-shaped inclined surfaces formed extending from two ends of the band-shaped recess in the width direction.

A fitting-equipped electrically conductive sheet according to a fourth aspect relates to the fitting-equipped electrically conductive sheet according to the third aspect. In the fitting-equipped electrically conductive sheet according to the fourth aspect, the sheet material is metal cloth that has a mesh structure in which metallic yarn is crossed and woven. Furthermore, the band-shaped flat surface of the band-shaped recess is formed so as to have a width that is larger than a pitch of the metallic yarn of the metal cloth.

A fitting-equipped electrically conductive sheet according to a fifth aspect relates to the fitting-equipped electrically conductive sheet according to any one of the first to third aspects. In the fitting-equipped electrically conductive sheet according to the fifth aspect, the sheet material is metal cloth that has a mesh structure in which metallic yarn is crossed and woven.

A fitting-equipped electrically conductive sheet according to a sixth aspect relates to the fitting-equipped electrically conductive sheet according to any one of the first to fifth aspects. In the fitting-equipped electrically conductive sheet according to the sixth aspect, the band-shaped recess is fanned along one straight line on only one of the pair of plate-shaped holding sections.

A fitting-equipped electrically conductive sheet according to a seventh aspect relates to the fitting-equipped electrically conductive sheet according to the first or second aspect. In the fitting-equipped electrically conductive sheet according to the seventh aspect, the band-shaped recess includes: two recesses that are formed in parallel on one of the pair of plate-shaped holding sections; and one recess that is formed at a position on the other one of the pair of plate-shaped holding sections that is opposite to a region between the two recesses.

A fitting-equipped electrically conductive sheet according to an eighth aspect relates to the fitting-equipped electrically conductive sheet according to any one of the first to seventh aspects. In the fitting-equipped electrically conductive sheet according to the eighth aspect, the pair of plate-shaped holding sections further includes a spot compression section at a location in an intermediate region between the folded-back section and opposite edge sections of the plate-shaped holding sections. The spot compression section is a section that is more strongly compressed than surrounding parts, and has a protrusion on a surface on one side of the overlapping pair of plate-shaped holding sections in a thickness direction and a recess on a surface on the other side.

A fitting-equipped electrically conductive sheet according to a ninth aspect relates to the fitting-equipped electrically conductive sheet according to the eighth aspect. In the fitting-equipped electrically conductive sheet according to the ninth aspect, the spot compression section is formed overlapping the band-shaped recess.

A fitting-equipped electrically conductive sheet according to a tenth aspect relates to the fitting-equipped electrically conductive sheet according to the eighth or ninth aspect. In the fitting-equipped electrically conductive sheet according to the tenth aspect, the protrusion on the surface on one side of the spot compression section is formed so as to have a width that is larger in a part on a vertex side than in a root part.

A fitting-equipped electrically conductive sheet according to an eleventh aspect relates to the fitting-equipped electrically conductive sheet according to any one of the first to seventh aspects. In the fitting-equipped electrically conductive sheet according to the tenth aspect, the crimp section has a curved section that is molded in a curved shape when viewed from the folded-back section side.

A fitting-equipped electrically conductive sheet according to a twelfth aspect relates to the fitting-equipped electrically conductive sheet according to any one of the first to eleventh aspects. In the fitting-equipped electrically conductive sheet according to the eleventh aspect, each of the edge sections of the pair of plate-shaped holding sections that are opposite to the folded-back section is formed so as to warp to a side that is opposite to the sheet material side.

Advantageous Effects

When the crimp section that is formed by a metal plate-shaped section being folded back is crimped to the sheet material with an edge section of the sheet material sandwiched therebetween, a so-called springback phenomenon occurs. Accordingly, the crimped state of the crimp section with respect to the sheet material is loosened when compression by a crimping machine (press machine) is removed as compared with the case where the crimp section is being compressed by the crimping machine.

Particularly, when both of the pair of plate-shaped holding sections that sandwich the sheet material are flat plate shaped, that is, the entire region of the pair of plate-shaped holding sections is uniformly pressed by the crimping machine, the springback amount of the crimp section from which the compression is removed is large. In this case, the pair of plate-shaped holding sections will entirely be in a state of making a small acute angle and being open, and the holding force of the pair of plate-shaped holding sections with respect to the sheet material is reduced. Therefore, it is difficult to achieve both a low connection resistance and a high fixing strength.

In the above-described aspect, one of the pair of plate-shaped holding sections between which the edge section of the sheet material is sandwiched has a band-shaped recess on the outer surface of the intermediate region thereof. The band-shaped recess is a part that is more strongly crimped to the sheet material than other parts. Particularly, the pair of plate-shaped holding sections is in more intimate contact with the sheet material in the bottom part of the band-shaped recess than in other parts.

According to the above-described aspect, it is possible to diminish the loosening of the holding force of the pair of plate-shaped holding sections due to a springback phenomenon, that is, to reduce the separation width of the entire pair of plate-shaped holding sections. As a result, the connection resistance between the pair of plate-shaped holding sections and the sheet material is reduced in the bottom part of the band-shaped recess. On the other hand, in the part of the pair of plate-shaped holding sections other than the bottom part of the band-shaped recess, a gentle intimate contact state can be realized in a broad area in order to achieve a sufficient fixing strength.

Thus, according to the fitting-equipped electrically conductive sheets of the above-described aspect, it is easy to achieve both a low connection resistance and a high fixing strength. Note that according to the above-described aspect, it is possible to reduce the pressure of the crimping machine as compared to the case where the entire region of the pair of plate-shaped holding sections is uniformly pressed by the crimping machine. As a result, effects of down-sizing and lower cost for the crimping equipment can be achieved.

Furthermore, in the second aspect, that part of the band-shaped recess that has the band-shaped inclined surface is in increasingly intimate contact with the sheet material toward a deep part of the band-shaped recess from a shallow part at an end of the band-shaped recess in the width direction.

Therefore, even in a case of some variation in the crimped state of the crimp section, at least a part of the region of the band-shaped recess that has the band-shaped inclined surface is in intimate contact to an extent appropriate for obtaining a sufficient fixing strength.

Thus, according to the second aspect, it is possible to reliably ensure a sufficient fixing strength even if the crimped state of the crimp section varies, thereby stabilizing the quality of the fitting-equipped electrically conductive sheet.

Furthermore, in the third aspect, that region of the band-shaped recess that has the band-shaped flat surface is a bottom region of the recess, and is a region that is in more intimate contact with the sheet material than other parts. According to the third aspect, a large region is formed that is in more intimate contact with the sheet material. Therefore, even if the crimped state of the crimp section varies, it will be possible to reliably reduce the connection resistance between the pair of plate-shaped holding sections and the sheet material, thereby stabilizing the quality of the fitting-equipped electrically conductive sheet.

Furthermore, in the fourth and fifth aspects, the sheet material is metal cloth that has a mesh structure in which metallic yarn is crossed and woven. The metal cloth is lightweight, is excellent in flexibility, and has better durability and air permeability at the time of bending deformation as compared with metal foil and the like. Accordingly, metal cloth is suitable for an electrical conducting medium that is installed in a vehicle such as an automobile, which is subject to a harsh environment in terms of vibration and temperature change.

Furthermore, in the fourth aspect, the band-shaped flat surface of the band-shaped recess is formed so as to have a width that is larger than the pitch of the metallic yarn of the metal cloth. This prevents a contact failure between the pair of plate-shaped holding sections and the metallic yarn of the sheet material that is caused due to a variation in the positional relationship between the crimp section and the sheet material. As a result, it is possible to reliably reduce the connection resistance between the pair of plate-shaped holding sections and the sheet material, thereby stabilizing the quality of the fitting-equipped electrically conductive sheet.

Moreover, the result of various tests shows that the balance between the connection resistance and the fixing strength is particularly favorable when the band-shaped recess is formed along one straight line on only one of the pair of plate-shaped holding sections.

Furthermore, in the eighth aspect, the spot compression section is a section in which a part of one of the pair of plate-shaped holding sections and a part of the other one are more firmly crimped. Thus, according to the eighth aspect, the spot compression section prevents a decrease in the holding force of the pair of plate-shaped holding sections with respect to the sheet material even in the case where a strong external force is applied to the connection fitting, heat expansion occurs in the connection fitting, and the like.

Meanwhile, if the spot compression section is formed in that part of the crimp section in that the degree of the intimate contact between the pair of plate-shaped holding sections is low, the crimped state of the band-shaped recess may possibly be loosened. Therefore, in the ninth aspect, the spot compression section is formed overlapping the band-shaped recess in which the degree of intimate contact between the pair of plate-shaped holding sections is high. Accordingly, it is possible to prevent the crimped state of the band-shaped recess from being loosened due to the formation of the spot compression section.

Furthermore, in the tenth aspect, the protrusion on the surface of one side of the spot compression section is formed so as to have a width that is larger in a part on a vertex side than in a root part. In this case, as will be described later, the spot compression section has an engagement structure in which the part of one of the pair of plate-shaped holding sections and the part of the other one are engaged with each other. Such a spot compression section reliably prevents a decrease in the holding force of the pair of plate-shaped holding sections.

Furthermore, in the eleventh aspect, the crimp section has a curved section that is molded in a curved shape when viewed from the folded-back section side. Similarly to the spot compression section, this curved section also prevents a decrease in the holding force of the pair of plate-shaped holding sections with respect to the sheet material due to the external force, heat expansion, or the like.

Furthermore, in the twelfth aspect, each of the edge sections of the pair of plate-shaped holding sections that are opposite to the folded-back section is formed so as to warp to a side that is opposite to the sheet material side. Accordingly, it is possible to prevent the sheet material from being caught and broken by the respective edge sections of the pair of plate-shaped holding sections.

DESCRIPTION OF EMBODIMENTS

Hereinafter, embodiments will be described with reference to the accompanying drawings. The embodiments below are examples that embody the present invention and do not restrict the technical scope of the present invention.
First Embodiment First, a configuration of a fitting-equipped electrically conductive sheet 1 according to a first embodiment will be described with reference to FIGS. 1 and 2. FIG. 2 is a cross-sectional view taken along the plane II-II of FIG. 1.

The fitting-equipped electrically conductive sheet 1 of the present embodiment is an electric component for electrically connecting two electrically conductive members. For example, the fitting-equipped electrically conductive sheet 1 electrically connects two metal housings that are installed in a vehicle such as an automobile. In this case, two ends of the fitting-equipped electrically conductive sheet 1 are respectively connected to the two metal housings that are installed in the vehicle such as an automobile. If one of the metal housings is connected to a reference potential body such as a vehicle body, both the two metal housings that are connected to each other by the fitting-equipped electrically conductive sheet 1 are in the state of being grounded.

Figure 1:
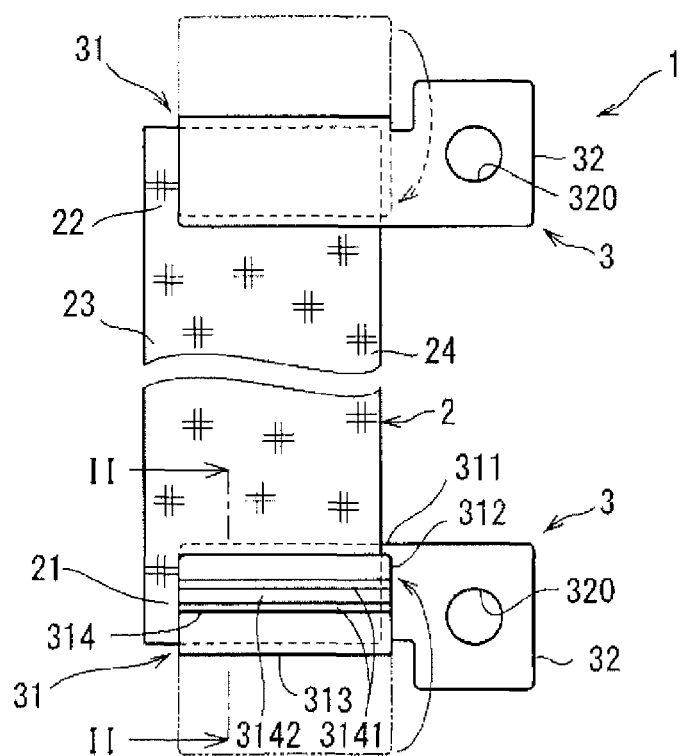
FIG. 1 is a plan view illustrating a fitting-equipped electrically conductive sheet 1 according to a first embodiment.
Figure 2:
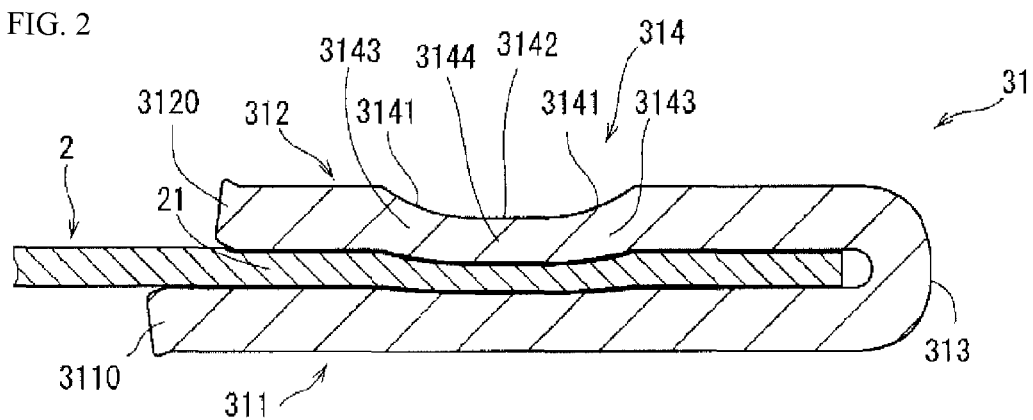
FIG. 2 is a cross-sectional view illustrating a part of a crimp section of a connection fitting of the fitting-equipped electrically conductive sheet 1.

As shown in FIG. 1, the fitting-equipped electrically conductive sheet 1 is provided with an electrically conductive sheet material 2 and connection fittings 3 for electrically connecting this sheet material 2 and another member. Examples of a connection target for the connection fitting 3 include a metal housing in which electric equipment is accommodated.
Sheet Material The electrically conductive sheet material 2 is, for example, metal cloth, metal foil, or the like. Metal cloth is a clothing fabric that has a mesh structure in which metallic yarn made mainly of, for example, copper is crossed and woven in longitudinal and lateral directions. Furthermore, the metal cloth may have a structure in which a flexible film made of a resin material is adhered to a clothing fabric made from metallic yarn. The metal cloth is lightweight, is excellent in flexibility, and has better durability and air permeability at the time of bending deformation as compared with metal foil and the like.

Accordingly, when the fitting-equipped electrically conductive sheet 1 is installed in a vehicle such as an automobile, which is subject to a harsh environment in terms of vibration and temperature change, it is preferable that the sheet material 2 be metal cloth.

In the following description, four edge sections of the sheet material 2 are respectively referred to as a first edge section 21, a second edge section 22, a third edge section 23, and a fourth edge section 24. The first edge section 21 and the opposite second edge section 22 are respectively sections to which the connection fittings 3 are crimped, and that have a predetermined range from the outer edge to the inside of the sheet material 2.
Connection Fitting The connection fitting 3 is a fitting for electrically connecting the sheet material 2 and another electrically conductive member. The connection fitting 3 that is crimped to the sheet material 2 can be obtained by subjecting a metal plate to, for example, bending and pressing. The material of the connection fitting 3 is, for example, copper alloy, iron, stainless steel, or the like. Furthermore, it is conceivable that the connection fitting 3 includes a metal core made mainly from copper or the like, and tin-plating formed on the surface of the metal core.

The fitting-equipped electrically conductive sheet 1 includes two connection fittings 3 that are respectively crimped to the first edge section 21 and the second edge section 22 of the sheet material 2.

Each connection fitting 3 has a crimp section 31 that is crimped to the edge section of the sheet material 2. In the present embodiment, the connection fitting 3 further has a connection section 32 for being directly connected to an electrically conductive member that is to be connected to the sheet material 2.

The crimp section 31 is a part that is formed by a plate-shaped section being folded back. In other words, the crimp section 31 is a double plate-shaped section that is bent by folding-back.

The crimp section 31 includes a pair of plate-shaped holding sections 311 and 312 between which the edge section of the sheet material 2 is sandwiched, and a folded-back section 313 that connects this pair of plate-shaped holding sections 311 and 312. One of the pair of plate-shaped holding sections 311 and 312 is connected to the connection section 32.

In the following description, the one of the pair of plate-shaped holding sections 311 and 312 that is connected to the connection section 32 is referred to as "first plate-shaped holding section 311", and the other one is referred to as "second plate-shaped holding section 312".

If the respective connection sections 32 of the two connection fittings 3 are connected to two connection targets (electrically conductive members), a current will flow from one to the other of the two connection targets via one connection fitting 3, the sheet material 2, and the other connection fitting 3.

If the two connection targets are metal housings in which electric equipment is accommodated, an earth current will flow from one to the other of the two metal housings via one connection fitting 3, the sheet material 2, and the other connection fitting 3. In this case, the fitting-equipped electrically conductive sheet 1 is a drain wire through which the earth current flows.

In a case where a high-frequency current flows between two connection targets and thus the inductance of an electrical conducting medium for electrically connecting the two connection targets needs to be suppressed to be low, it is preferable to employ a fitting-equipped electrically conductive sheet 1 that includes an electrically conductive sheet material 2 having a low inductance. Furthermore, if the relative positions of the two connection targets change due to vibration or the like, it is preferable to employ a fitting-equipped electrically conductive sheet 1 that includes, as the sheet material 2, metal cloth that is excellent in flexibility and in durability at the time of bending deformation.

One of the pair of plate-shaped holding sections 311 and 312 has a band-shaped recess 314 that is hand-shaped by being more strongly crimped to the sheet material 2 than other parts. The band-shaped recess 314 is formed on the outer surface of an intermediate region between the folded-back section 313 and the opposite edge section of one of the pair of plate-shaped holding sections 311 and 312. For example, the band-shaped recess 314 is in the shape of a band that is parallel to the ridge line (folded-back line) of the folded-back section 313. This example is an example in which the band-shaped recess 314 is in the shape of a band that extends in a direction of the ridge line of the folded-back section 313.

In the present embodiment, the band-shaped recess 314 is formed along one straight line only on the second plate-shaped holding section 312. Accordingly, other than an edge section 3110 opposite to the folded-back section 313, the first plate-shaped holding section 311 has a flat outer surface.

The band-shaped recess 314 is a part of the second plate-shaped holding section 312 that is more strongly crimped to the sheet material 2 than other parts. Particularly, the pair of plate-shaped holding sections 311 and 312 are in more intimate contact with the sheet material 2 at a bottom part 3144 of the band-shaped recess 314 than at other parts.

FIG. 2 is a cross-sectional view of the crimp section 31 of the fitting-equipped electrically conductive sheet 1. As shown in FIGS. 1 and 2, the surface of the band-shaped recess 314 includes band-shaped inclined surfaces 3141 extending in the longitudinal direction of the band-shaped recess 314. Each band-shaped inclined surface 3141 is an inclined surface that is formed so as to become gradually deeper from an end of the band-shaped recess 314 in the width direction toward a position that is closer to the center.

In the present embodiment, the surface of the band-shaped recess 314 includes a pair of band-shaped inclined surfaces 3141 that are respectively formed so as to become gradually deeper from two ends of the band-shaped recess 314 in the width direction toward positions that are closer to the center. In the example shown in FIG. 2, each of the band-shaped inclined surfaces 3141 is an arc surface whose inclination angle is gradually reduced toward a position closer to the center from an end of the band-shaped recess 314 in the width direction.

In the present embodiment, the surface of the band-shaped recess 314 further includes a band-shaped flat surface 3142 in the longitudinal direction of the band-shaped recess 314. The band-shaped flat surface 3142 is a surface that is formed at a constant depth between the pair of band-shaped inclined surfaces 3141. Accordingly, that part of the band-shaped recess 314 that has the band-shaped flat surface 3142 constitutes the bottom part 3144 of the band-shaped recess 314.

A section 3143 of the band-shaped recess 314 that has the band-shaped inclined surface 3141 is in increasingly intimate contact with the sheet material 2 toward a deep part of the band-shaped recess 314 from a shallow part at an end of the band-shaped recess 314 in the width direction.

If the sheet material 2 is metal cloth, it is desirable that the band-shaped flat surface 3142 of the band-shaped recess 314 is formed so as to have a width that is larger than the pitch of metallic yarn of the metal cloth (sheet material 2). For example, when the pitch of the metallic yarn of the metal cloth constituting the sheet material 2 is 0.5 millimeters, it is conceivable that the width of the band-shaped flat surface 3142 is 1.0 millimeter or more.

Furthermore, the edge sections 3110 and 3120 of the pair of plate-shaped holding sections 311 and 312 that are opposite to the folded-back section 313 are respectively curved (warped) to sides that are opposite to the sheet material 2. This can prevent the sheet material 2 from being caught and broken by the respective edge sections 3110 and 3120 of the pair of plate-shaped holding sections 311 and 312.

Figure 3:
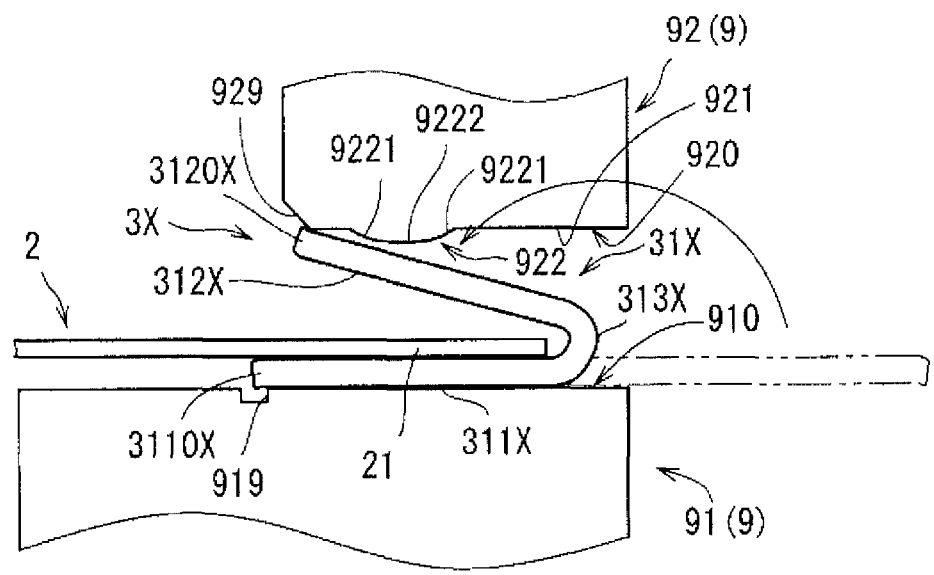
FIG. 3 is a diagram illustrating a state at the start of a crimping step of a process for manufacturing the fitting-equipped electrically conductive sheet 1.
Figure 4:
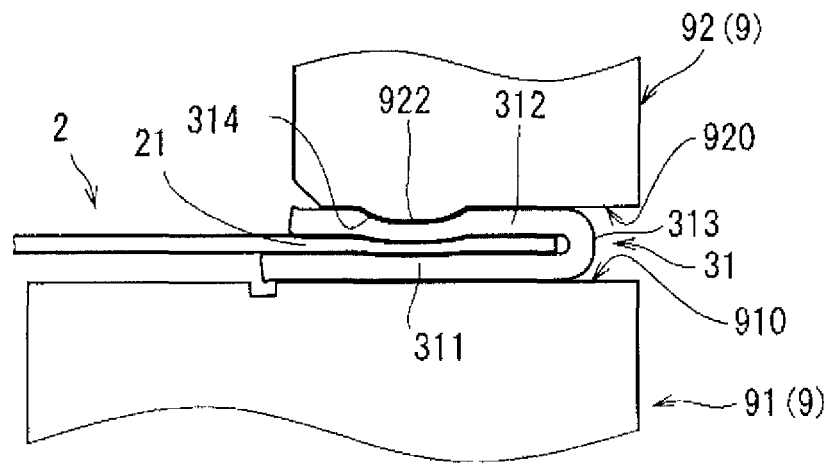
FIG. 4 is a diagram illustrating a state during the crimping step of the process for manufacturing the fitting-equipped electrically conductive sheet 1.

The following will describe a crimping step of crimping the connection fitting 3 to the sheet material 2 with reference to FIGS. 3 and 4. The crimping step is a step of pressing a crimp section of a pre-crimp fitting 3x, which serves as a bent metal plate from which the connection fitting 3 is formed, and obtaining the connection fitting 3 crimped to the sheet material 2.

As shown in FIG. 3, a crimp section 31x of the pre-crimp fitting 3x is bent at a sharp angle in advance. The crimp section 31x of the pre-crimp fitting 3x includes a pair of plate-shaped holding sections 311x and 312x, which are located at two sides of a gap into which an edge section of the sheet material 2 is inserted and make an acute angle, and a curved section 313x that connects this pair of plate-shaped holding sections 311x and 312x. Edge sections 3110x and 3120x of the pair of plate-shaped holding sections 311x and 312x are respectively curved (warped) to sides that are opposite to the sides on which the edge sections face each other.

With the crimping step, the pair of plate-shaped holding sections 311x and 312x, and the curved section 313x are respectively turned into the pair of plate-shaped holding sections 311 and 312, and the folded-back section 313 of the connection fitting 3.

A crimping machine 9 that subjects the pre-crimp fitting 3x to pressing includes a lower die 91 and an upper die 92 that sandwich and mold the crimp section 31x of the pre-crimp fitting 3x. The lower die 91 is a die that has a first shaping surface 910 for shaping the outer surface of the first plate-shaped holding section 311x. The upper die 92 is a die that has a second shaping surface 920 for shaping the outer surface of the second plate-shaped holding section 312x.

The first shaping surface 910 is flat in a region other than a part that faces the warped (curved) edge section 3110x of the first plate-shaped holding section 311x. Furthermore, the first shaping surface 910 has a groove 919 for prevention of contact with the warped edge section 3110x of the first plate-shaped holding section 311x.

The second shaping surface 920 includes a flat surface 921 and a protrusion surface 922 in a region other than a part that faces the warped edge section 3120x of the second plate-shaped holding section 312x. Furthermore, the second shaping surface 920 has a cut-off section 929 for prevention of contact with the warped edge section 3120x of the second plate-shaped holding section 312x.

The protrusion surface 922 of the second shaping surface 920 is formed in the shape of a band along a straight line. That is, in FIG. 3, the protrusion surface 922 is formed in the shape of a band in the depth direction of the figure. The protrusion surface 922 of the second shaping surface 920 is a part with which the band-shaped recess 314 of the connection fitting 3 is molded.

The protrusion surface 922 of the second shaping surface 920 includes band-shaped side surfaces 9221 in the longitudinal direction thereof. Each side surface 9221 of the protrusion surface 922 is an inclined surface that is formed so as to be gradually higher from an end of the protrusion surface 922 in the width direction to a position that is closer to the center.

In the present embodiment, the protrusion surface 922 includes a pair of side surfaces 9221, which are formed so as to become gradually higher from two ends thereof in the width direction toward positions that are closer to the center. In the example shown in FIG. 3, each of the inclined side surfaces 9221 is an arc surface whose inclination angle is gradually reduced toward a position closer to the center from an end of the protrusion surface 922 in the width direction.

Furthermore, in the present embodiment, the protrusion surface 922 further includes a flat vertex surface 9222 in the longitudinal direction thereof. The vertex surface 9222 of the protrusion surface 922 is a surface that is formed between the pair of band-shaped inclined surfaces 3141 so as to have a constant height. The pair of side surfaces 9221 and the vertex surface 9222 of the protrusion surface 922 are the parts with which the pair of band-shaped inclined surfaces 3141 and the band-shaped flat surface 3142 of the band-shaped recess 314 of the connection fitting 3 are molded.

As shown in FIG. 4, by the lower die 91 and the upper die 92 of the crimping machine 9 sandwiching the crimp section 31x of the pre-crimp fitting 3x, the crimp section 31 of the connection fitting 3 as shown in FIG. 2 is formed.

As described above, the present embodiment is an example in which the crimp structure (see FIG. 2) of the connection fitting 3 with respect to the electrically conductive sheet material 2 is applied to the fitting-equipped electrically conductive sheet 1 that functions as a drain wire.

Effects

When the crimp section that is formed by a metal plate-shaped section being folded back is crimped to the sheet material 2 with an edge section of the sheet material 2 sandwiched, a so-called springback phenomenon occurs. Accordingly, the crimped state of the crimp section 31 with respect to the sheet material 2 is loosened when compression of the crimping machine 9 is removed as compared with the time when the crimp section 31 of the connection fitting 3 is being compressed by the crimping machine 9.

Particularly, when both of the pair of plate-shaped sections that sandwich the sheet material 2 are flat plate shaped, that is, the entire region of the pair of plate-shaped holding sections 311x and 312x is uniformly pressed by the crimping machine 9, the springback amount of the crimp section from which the compression is removed is large. In this case, the entire pair of plate-shaped sections will be in a state of defining a small acute angle and being open, and the holding force of the pair of plate-shaped sections with respect to the sheet material 2 is reduced. Therefore, it is difficult to achieve both a low connection resistance and a high fixing strength.

In the fitting-equipped electrically conductive sheet 1, one of the pair of plate-shaped holding sections 311 and 312 between which an edge section of the sheet material 2 is sandwiched has the band-shaped recess 314 on the outer surface of the intermediate region. The band-shaped recess 314 is more strongly crimped to the sheet material 2 than other parts. Particularly, the pair of plate-shaped holding sections 311 and 312 are in more intimate contact with the sheet material 2 in the bottom part 3144 of the band-shaped recess 314 than in other parts.

When the fitting-equipped electrically conductive sheet 1 is employed, it is possible to diminish the loosening of the holding force of the pair of plate-shaped holding sections 311 and 312 due to a springback phenomenon, that is, to reduce the separation width of the entire pair of plate-shaped holding sections 311 and 312. As a result, the connection resistance between the pair of plate-shaped holding sections 311 and 312, and the sheet material 2 is reduced in the bottom part 3144 of the band-shaped recess 314. On the other hand, in the part of the pair of plate-shaped holding sections 311 and 312 other than the bottom part 3144 of the band-shaped recess 314, a gentle intimate contact state can be realized in a broad area in order to achieve a sufficient fixing strength.

Accordingly, when the fitting-equipped electrically conductive sheet 1 is employed, it is easy to achieve both a low connection resistance and a high fixing strength. Furthermore, when the fitting-equipped electrically conductive sheet 1 is employed, it is possible to reduce a pressure of the crimping machine 9 as compared to the case where the entire region of the pair of plate-shaped holding sections 311 and 312 is uniformly pressed by the crimping machine 9. As a result, effects of down-sizing and lower cost for the crimping equipment can be achieved.

Furthermore, in the fitting-equipped electrically conductive sheet 1, that part of the band-shaped recess 314 that has the band-shaped inclined surface 3141 is in increasingly intimate contact with the sheet material 2 toward a deep part of the recess from a shallow part at an end of the band-shaped recess 314 in the width direction. Therefore, even in a case of some variation in the crimped state of the crimp section 31, at least a partial region of the section 3143 of the band-shaped recess 314 that has the band-shaped inclined surface 3141 is in intimate contact to an extent appropriate for obtaining a sufficient fixing strength.

Accordingly, when the fitting-equipped electrically conductive sheet 1 is employed, it is possible to reliably ensure a sufficient fixing strength even if the crimped state of the crimp section 31 varies, thereby stabilizing the quality of the fitting-equipped electrically conductive sheet 1.

Furthermore, in the fitting-equipped electrically conductive sheet 1, the bottom part 3144 of the band-shaped recess 314 that has the band-shaped flat surface 3142 is a region that is in more intimate contact with the sheet material 2 than other parts. In the fitting-equipped electrically conductive sheet 1, a large part is formed that is in more intimate contact with the sheet material 2. Therefore, even if the crimped state of the crimp section 31 varies, it will be possible to reliably reduce the connection resistance between the pair of plate-shaped holding sections 311 and 312, and the sheet material 2, thereby stabilizing the quality of the fitting-equipped electrically conductive sheet 1.

Furthermore, metal cloth that can be employed as the sheet material 2 is lightweight, is excellent in flexibility, and has better durability and air permeability at the time of bending deformation as compared with metal foil or the like. Accordingly, metal cloth is suitable for the sheet material 2 of the fitting-equipped electrically conductive sheet 1 that is installed in a vehicle such as an automobile, which is subject to a harsh environment in terms of vibration and temperature change.

Furthermore, if the sheet material 2 is metal cloth, it is desirable that the band-shaped flat surface 3142 of the band-shaped recess 314 is formed so as to have a width that is larger than the pitch of metallic yarn of the metal cloth. This prevents a contact failure between the pair of plate-shaped holding sections 311 and 312, and the metallic yarn of the sheet material 2 that is caused due to a variation in the positional relationship between the crimp section 31 and the sheet material 2. As a result, it is possible to reliably reduce the connection resistance between the pair of plate-shaped holding sections 311 and 312, and the sheet material 2, thereby stabilizing the quality of the fitting-equipped electrically conductive sheet 1.

Moreover, the result of various tests shows that the balance between the connection resistance and the fixing strength is particularly favorable when the band-shaped recess 314 is formed along one straight line on only one of the pair of plate-shaped holding sections 311 and 312.

Second Embodiment

Figure 5:
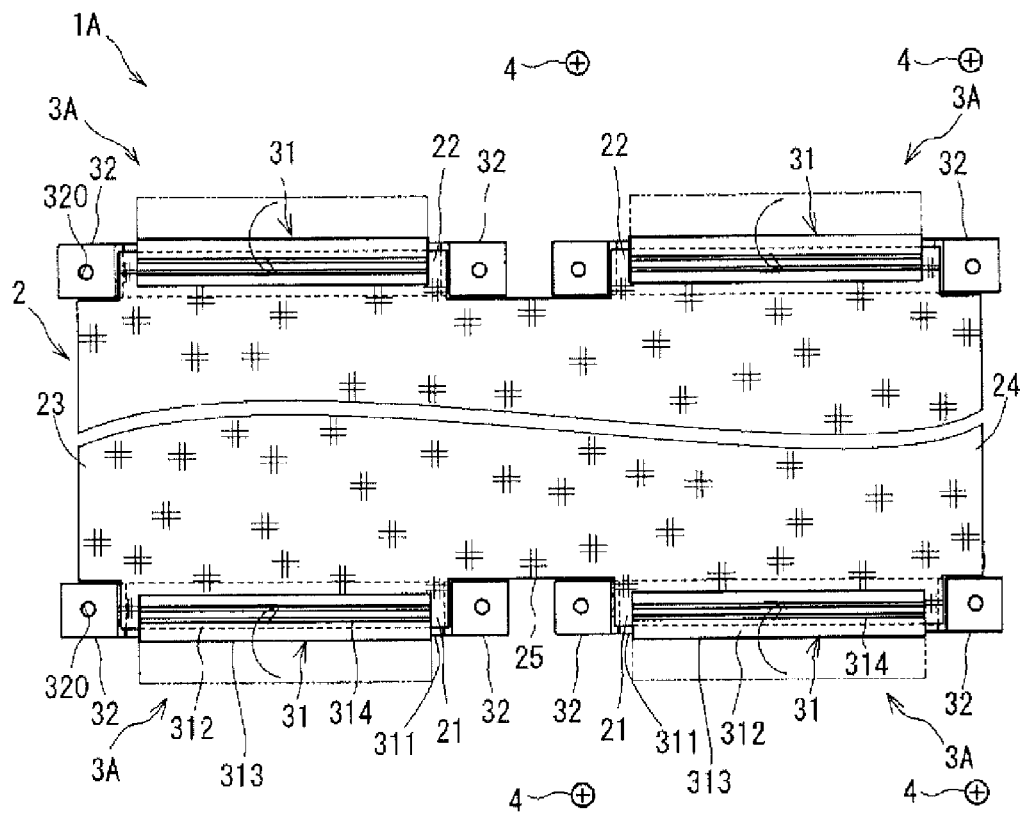
FIG. 5 is a plan view illustrating a fitting-equipped electrically conductive sheet 1A according to a second embodiment.
Figure 6:
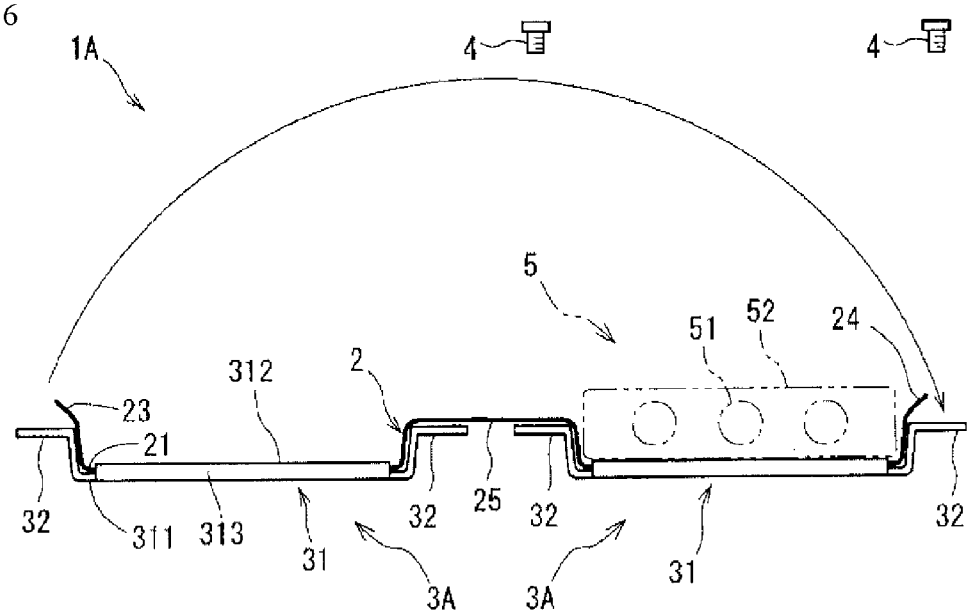
FIG. 6 is a front view of the fitting-equipped electrically conductive sheet 1A.
Figure 7:
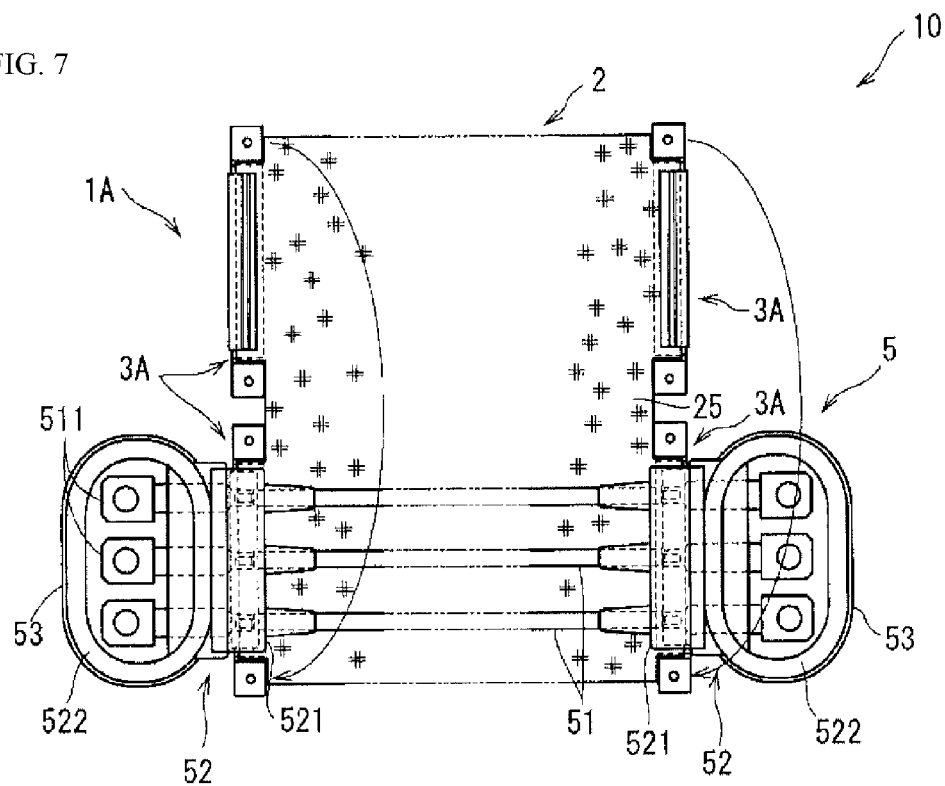
FIG. 7 is an exploded plan view illustrating a wire harness 10 including the fitting-equipped electrically conductive sheet 1A.
Figure 8:
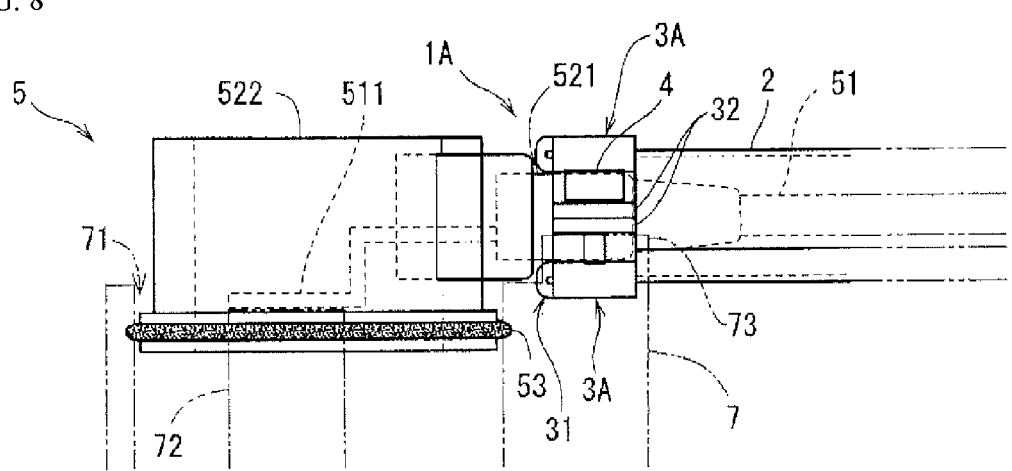
FIG. 8 is a side view illustrating an end of the wire harness 10.

Hereinafter, a fitting-equipped electrically conductive sheet 1A according to a second embodiment and a wire harness 10 including this will be described with reference to FIGS. 5 to 8. FIG. 5 is a plan view illustrating the fitting-equipped electrically conductive sheet 1A. FIG. 6 is a front view of the fitting-equipped electrically conductive sheet 1A. FIG. 7 is an exploded plan view illustrating the wire harness 10 that is provided with the fitting-equipped electrically conductive sheet 1A. FIG. 8 is a side view illustrating an end of the wire harness 10. In FIGS. 5 to 8, the same reference numerals are given to the same constituent components as the constituent components shown in FIGS. 1 and 2.

Similarly to the fitting-equipped electrically conductive sheet 1, the fitting-equipped electrically conductive sheet 1A is provided with the electrically conductive sheet material 2, and connection fittings 3A that are crimped to edge sections of the sheet material 2. Furthermore, the crimp sections 31 of the connection fittings 3A are crimped to the sheet material 2 in the same crimp structure as that of the crimp section 31 of the connection fitting 3.

However, the fitting-equipped electrically conductive sheet 1A is different in use from the fitting-equipped electrically conductive sheet 1. The fitting-equipped electrically conductive sheet 1A serves as an electromagnetic shielding tool for shielding noise electromagnetic waves of the wire harness 10 installed in the vehicle.

The fitting-equipped electrically conductive sheet 1A includes an electrically conductive sheet material 2, and four connection fittings 3A. Two connection fittings 3A are crimped to the first edge section 21 of the sheet material 2 while being aligned in a line, and the remaining two connection fittings 3A are crimped to the second edge section 22 of the sheet material 2 while being aligned in a line.

Each connection fitting 3A has a crimp section 31 that is crimped to an edge section of the sheet material 2, and two connection sections 32 that are connected to two ends of the crimp section 31. The crimp section 31 of each connection fitting 3A is crimped to the sheet material 2 with the same structure as that of the crimp section 31 of the connection fitting 3 shown in FIG. 2.

The two connection fittings 3A that are crimped to the first edge section 21 of the sheet material 2 are formed into a ring by being combined with each other. Similarly, the two connection fittings 3A that are crimped to the second edge section 22 of the sheet material 2 are formed into a ring by being combined with each other.

As shown in FIG. 7, the fitting-equipped electrically conductive sheet 1A is attached to a connector-equipped electric wire group 5. The connector-equipped electric wire group 5 includes a plurality of terminal-equipped electric wires 51, and two connectors 52. Each terminal-equipped electric wire 51 is an insulating electric wire to whose ends terminal fittings 511 are respectively connected.

Each connector 52 is a non-conductive member that holds the ends of the plurality of terminal-equipped electric wires 51 so that they are aligned in parallel. For example, the connector 52 is a synthetic resin molded member that is formed by insert molding with the ends of the plurality of terminal-equipped electric wires 51 serving as inserts.

The connector 52 includes an electric wire holding section 521 and a terminal enclosing section 522. The electric wire holding section 521 is a part for holding the ends of the plurality of terminal-equipped electric wires 51 in parallel. The terminal enclosing section 522 is a tubular part that encloses the terminal fittings 511 of the terminal-equipped electric wires 51 aligned in parallel.

The opening of the tubular terminal enclosing section 522 is an opening for accessing the terminal fittings 511. The opening of the terminal enclosing section 522 is closed with a not-shown cap member after the terminal fittings 511 are connected to terminal parts of a counterpart device with screws or the like.

The two connection fittings 3A that are crimped to the first edge section 21 of the sheet material 2 are combined with each other from two sides of the electric wire holding section 521 of the connector 52 at a first end of the connector-equipped electric wire group 5. Accordingly, the two connection fittings 3A are combined with each other with the electric wire holding section 521 sandwiched therebetween, and is formed into a ring along the outer surface of the electric wire holding section 521.

Similarly, the two connection fittings 3A that are crimped to the second edge section 22 of the sheet material 2 are combined with each other from two sides of the electric wire holding section 521 of the connector 52 at a second end of the connector-equipped electric wire group 5. At that time, the two connection fittings 3A are combined with each other in the state in which their connection sections 32 overlap each other.

After the four connection fittings 3A are combined two by two in the above-described manner, at both the first edge section 21 and the second edge section 22 of the sheet material 2, two connection fittings 3A are combined with each other with the electric wire holding section 521 sandwiched therebetween, and are formed into a ring along the outer surface of the electric wire holding section 521.

By combining the four connection fittings 3A two by two into a ring, the sheet material 2 is folded at the intermediate section 25, and is held so as to be tubular surrounding the plurality of terminal-equipped electric wires 51. At that time, it is desirable that the sheet material 2 is tubular-shaped in a state in which the third edge section 23 and the fourth edge section 24 of the sheet material 2 overlap each other.

The terminal enclosing section 522 is fitted into a frame of an opening 71 of a housing 7 for accommodating a device to be connected by the terminal-equipped electric wires 51. In FIG. 8, the housing 7 and a terminal block 72 of the device accommodated in the housing 7 are indicated by phantom lines (two-dot chain lines).

A gasket 53, which is a ring-shaped elastic member, is attached to the outer circumferential surface of the terminal enclosing section 522. By the terminal enclosing section 522 of the connector 52 being fitted into the frame of the opening 71 of the housing 7, the gasket 53 is sandwiched between the terminal enclosing section 522 and the frame of the housing 7. Therefore, the gasket 53 fills the gap between the terminal enclosing section 522 and the frame of the opening 71 of the housing 7.

In the state in which the terminal enclosing section 522 of the connector 52 is fitted into the frame of the opening 71 of the housing 7, each of the terminal fittings 511 in the terminal enclosing section 522 is connected to the terminal block 72 connected to the device in the housing 7 by a screw or the like.

Furthermore, the overlapping connection sections 32 of two connection fittings 3A that are combined into a ring are fixed, by a screw 4, to a fixed seat 73, which is a part of the housing 7. Accordingly, the electrically conductive sheet material 2 is electrically connected to the metal housing 7 via the connection fittings 3A.

Accordingly, an earth current flows between the sheet material 2, which functions as an electromagnetic shield member surrounding the terminal-equipped electric wires 51, and the housing 7, which serves as a reference potential body.

As described above, the present embodiment is an example in which the crimp structure (see FIG. 2) of the connection fitting 3 with respect to the electrically conductive sheet material 2 is applied to the fitting-equipped electrically conductive sheet 1A that functions as an electromagnetic shielding tool.

Effects

When the fitting-equipped electrically conductive sheet 1A is employed, the same effects can be achieved as those in the case where the fitting-equipped electrically conductive sheet 1 is employed.

Furthermore, in the fitting-equipped electrically conductive sheet 1A, two connection fittings 3A that are crimped to the edge section of the electrically conductive sheet material 2 while being aligned in a line are combined with each other from two sides of the connector-equipped electric wire group 5 and are held in the shape of a ring, and thereby the sheet material 2 is tubular-shaped surrounding the terminal-equipped electric wires 51.

That is, since the fitting-equipped electrically conductive sheet 1A does not need to be tubular-shaped in advance, it can be attached to the connector-equipped electric wire group 5 later. More specifically, the fitting-equipped electrically conductive sheet 1A can be mounted on the electric wires to whose ends the connector 52 and the like are attached, and can also be mounted on the electric wires that were laid from the outside to the inside of the housing 7.

Furthermore, the four connection fittings 3A play roles of holding the sheet material 2 so that it is tubular, and maintaining electrical connection between the sheet material 2 and other electrically conductive members such as metal housings. Accordingly, when the fitting-equipped electrically conductive sheet 1A is employed, the number of steps for management and handling of the components is simplified as compared to the case where conventional braided wires and compression fittings are employed and thus a plurality of components are handled.

Furthermore, since the electrically conductive sheet material 2 is flexible, the fitting-equipped electrically conductive sheet 1A can surround electric wires extending along a curved pathway.

Crimp Structure of Connection Fitting According to First Application Example

Figure 9:
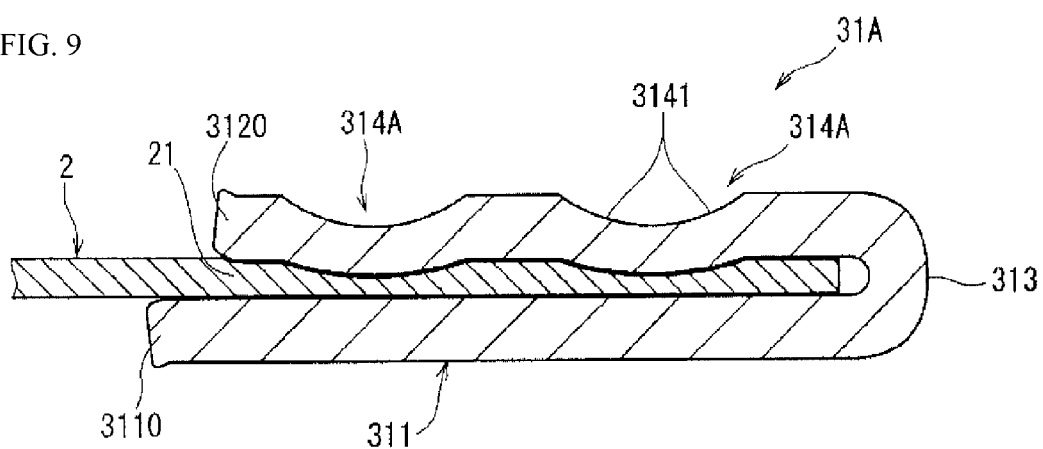
FIG. 9 is a cross-sectional view illustrating a part of a crimp section of a connection fitting according to a first application example, the connection fitting being applicable to the fitting-equipped electrically conductive sheets 1 and 1A.

The following will describe a crimp structure of a connection fitting according to a first application example that is applicable to the fitting-equipped electrically conductive sheets 1 and 1A with reference to FIG. 9. FIG. 9 is a cross-sectional view of a crimp section 31A according to the first application example, the figure corresponding to FIG. 2.

The crimp section 31 of the connection fittings 3 and 3A of the fitting-equipped electrically conductive sheets 1 and 1A has the band-shaped recess 314 that is formed along one straight line only on the second plate-shaped holding section 312. Furthermore, other than the edge section 3110, the first plate-shaped holding section 311 has a flat outer surface.

Also in the crimp section 31A of the first application example, the second plate-shaped holding section 312 has band-shaped recesses 314A that are band-shaped by being more strongly crimped to the sheet material 2 than other parts.

However, the band-shaped recesses 314A are formed in two parallel lines with a gap only on the second plate-shaped holding section 312. Accordingly, other than the edge section 3110 opposite to the folded-back section 313, the first plate-shaped holding section 311 of the crimp section 31A has a flat outer surface.

Furthermore, the surface of each band-shaped recess 314A includes the band-shaped inclined surfaces 3141 in the longitudinal direction of the band-shaped recess 314A. Each band-shaped inclined surface 3141 is an inclined surface that is formed so as to become gradually deeper from an end of the band-shaped recess 314A in the width direction toward a position closer to the center.

In the present application example, the surface of the band-shaped recess 314A includes a pair of band-shaped inclined surfaces 3141A that are formed so as to become gradually deeper from two ends of the band-shaped recess 314A in the width direction toward positions closer to the center. Furthermore, the band-shaped inclined surface 3141A is an arc surface whose inclination angle is gradually reduced toward a position closer to the center from an end of the band-shaped recess 314 in the width direction.

In the example shown in FIG. 9, the surface of the band-shaped recess 314A does not include the band-shaped flat surface 3142 (see FIG. 2), which is formed at a constant depth, between the pair of band-shaped inclined surfaces 3141. Note that it is also conceivable that the surface of the band-shaped recess 314A includes the band-shaped flat surface 3142.

When the structure of the crimp section 31A is employed in the connection fitting 3 or 3A, it is possible to diminish loosening of the holding force of the pair of plate-shaped holding sections 311 and 312 due to a springback phenomenon, that is, to reduce the separation width of the entire pair of plate-shaped holding sections 311 and 312, as compared with the case where both of the pair of plate-shaped sections that sandwich the sheet material 2 are flat plate-shaped.

Accordingly, when the structure of the crimp section 31A is employed, it is easy to achieve both a low connection resistance and a high fixing strength. Furthermore, when the structure of the crimp section 31A is employed, it is possible to reduce the pressure of the crimping machine 9 as compared to the case where the entire region of the pair of plate-shaped holding sections 311 and 312 is uniformly pressed by the crimping machine 9. As a result, effects of down-sizing and lower cost for the crimping equipment can be achieved.

Crimp Structure of Connection Fitting According to Second Application Example

Figure 10:
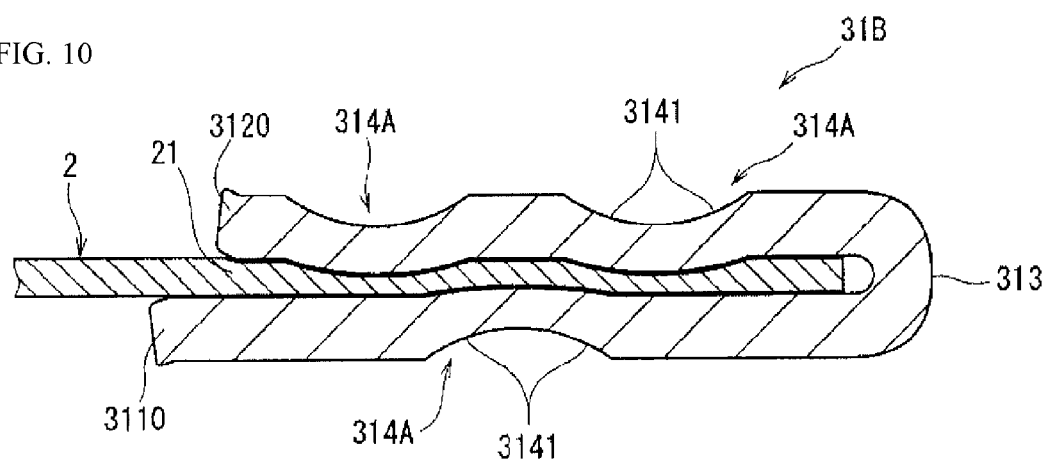
FIG. 10 is a cross-sectional view illustrating a part of a crimp section of a connection fitting according to a second application example, the connection fitting being applicable to the fitting-equipped electrically conductive sheets 1 and 1A.

The following will describe a crimp structure of a connection fitting according to a second application example that is applicable to the fitting-equipped electrically conductive sheets 1 and 1A with reference to FIG. 10. FIG. 10 is a cross-sectional view of a crimp section 31B according to the second application example, the figure corresponding to FIGS. 2 and 9.

The second plate-shaped holding section 312 of the crimp section 31B has the same structure as that of the second plate-shaped holding section 312 of the crimp section 31A. That is, the second plate-shaped holding section 312 of the crimp section 31B has the band-shaped recesses 314A that are formed in two parallel lines.

Furthermore, in the crimp section 31B, similarly to the second plate-shaped holding section 312, also the first plate-shaped holding section 311 has a band-shaped recess 314A. The band-shaped recess 314A of the first plate-shaped holding section 311 is formed in one line at a position that is opposite to the region between the regions of the second plate-shaped holding section 312 in which the band-shaped recesses 314A in two lines are respectively formed.

Furthermore, the surface of each of the band-shaped recesses 314A of the first plate-shaped holding section 311 and the second plate-shaped holding section 312 includes the band-shaped inclined surfaces 3141 in the longitudinal direction of the band-shaped recesses 314A. In the present application example, the surface of the band-shaped recess 314A includes a pair of band-shaped inclined surfaces 3141 that are formed so as to become gradually deeper from two ends of the band-shaped recess 314A in the width direction toward positions closer to the center.

In the example shown in FIG. 10, the surface of the band-shaped recess 314A does not include the band-shaped flat surface 3142 (see FIG. 2), which is formed at a constant depth, between the pair of band-shaped inclined surface 3141. Note that it is also conceivable that the surface of the band-shaped recess 314A includes the hand-shaped flat surface 3142.

Also in the case where the structure of the crimp section 31B is employed in the connection fitting 3 or 3A, the same effects can be achieved as in the case where the structure of the crimp section 31A is employed.

Crimp Structure of Connection Fitting According to Third Application Example

Figure 11:
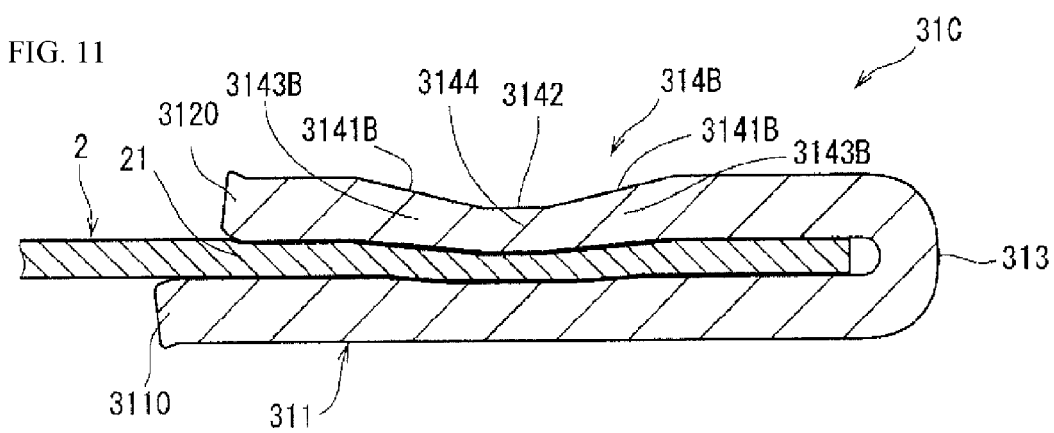
FIG. 11 is a cross-sectional view illustrating a part of a crimp section of a connection fitting according to a third application example, the connection fitting being applicable to the fitting-equipped electrically conductive sheets 1 and 1A.

The following will describe a crimp structure of a connection fitting according to a third application example that is applicable to the fitting-equipped electrically conductive sheets 1 and 1A with reference to FIG. 11. FIG. 11 is a cross-sectional view of a crimp section 31C according to the third application example, the figure corresponding to FIG. 2.

Also in the crimp section 31C, the second plate-shaped holding section 312 has a band-shaped recess 314B that is formed by being more strongly crimped to the sheet material 2 than other parts.

The band-shaped recess 314B is formed along one straight line only on the second plate-shaped holding section 312. Accordingly, other than the edge section 3110 opposite to the folded-back section 313, the first plate-shaped holding section 311 has a flat outer surface.

Furthermore, the surface of the band-shaped recess 314B includes band-shaped inclined surfaces 3141B extending in the longitudinal direction of the band-shaped recess 314A. Each band-shaped inclined surface 3141B is an inclined surface that is formed so as to become gradually deeper from an end of the band-shaped recess 314A in the width direction toward a position closer to the center.

A section 3143B of the band-shaped recess 314B in which the band-shaped inclined surface 3141B is formed is in more and more intimate contact with the sheet material 2 from a shallower part at an end of the band-shaped recess 314B in the width direction toward a deeper part of the band-shaped recess 314B.

In the present application example, the surface of the band-shaped recess 314B includes a pair of band-shaped inclined surfaces 3141B that are formed so as to become gradually deeper from two ends of the band-shaped recess 314B in the width direction toward positions closer to the center. Each band-shaped inclined surface 3141B is a plane inclined at a constant angle.

Furthermore, the surface of the band-shaped recess 314B includes the band-shaped flat surface 3142, which is formed at a constant depth, between the pair of band-shaped inclined surfaces 3141B.

Also in the case where the structure of the crimp section 31C is employed in the connection fitting 3 or 3A, the same effects can be achieved as those in the case where the structure of the crimp section 31 is employed.

Third Embodiment

Figure 12:
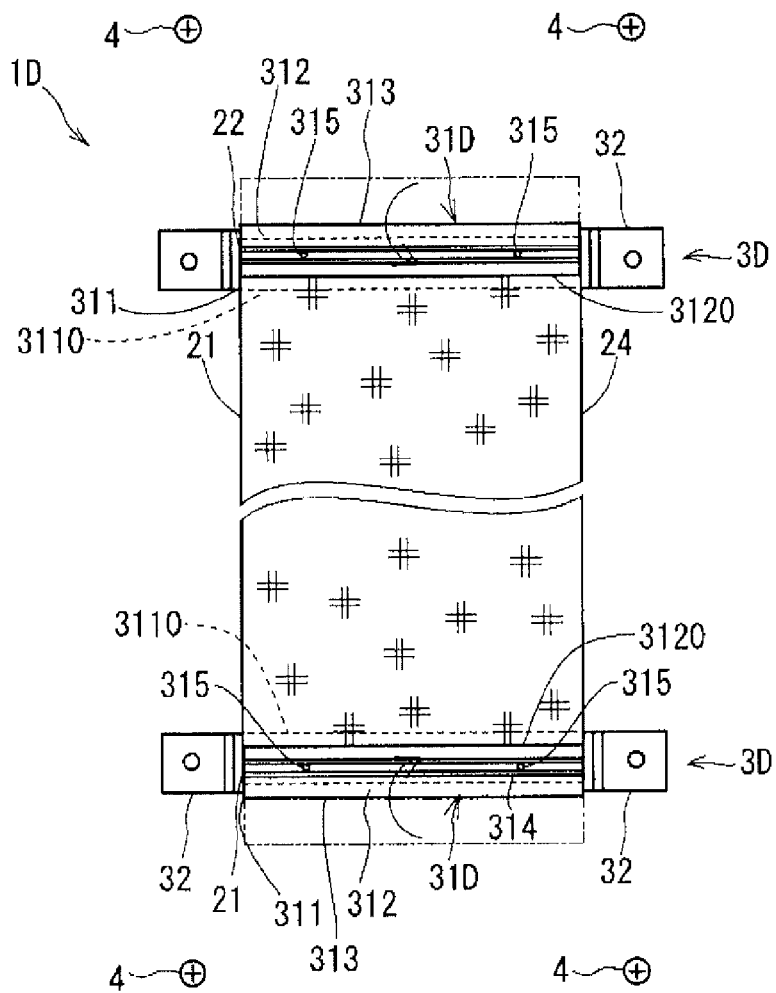
FIG. 12 is a plan view illustrating a fitting-equipped electrically conductive sheet 1D according to a third embodiment.
Figure 13:
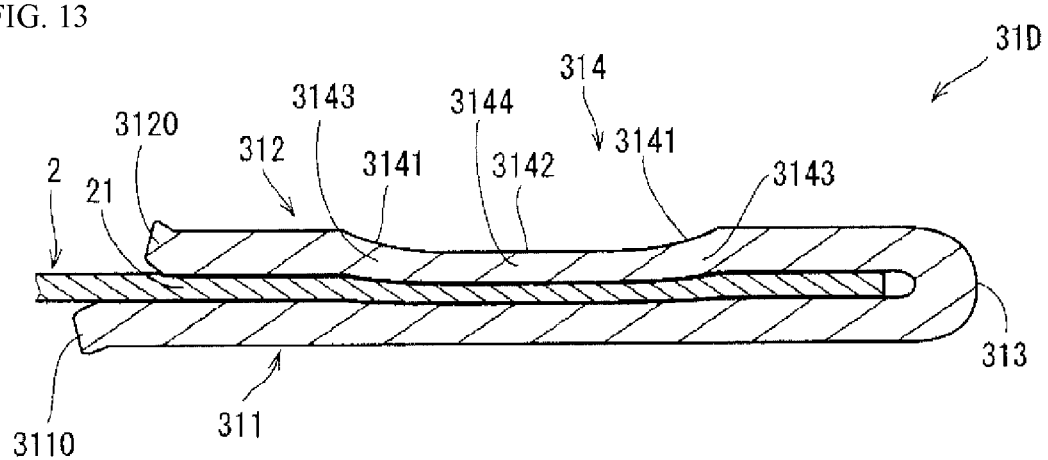
FIG. 13 is a cross-sectional view illustrating a crimp section of a connection fitting of the fitting-equipped electrically conductive sheet 1D.
Figure 14:
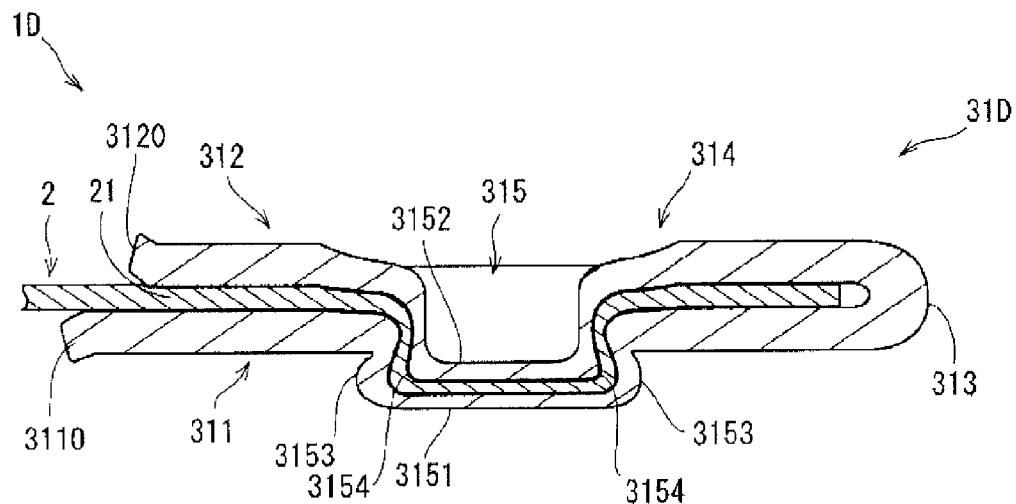
FIG. 14 is a cross-sectional view illustrating a spot compression section of the connection fitting of the fitting-equipped electrically conductive sheet 1D.
Figure 15:
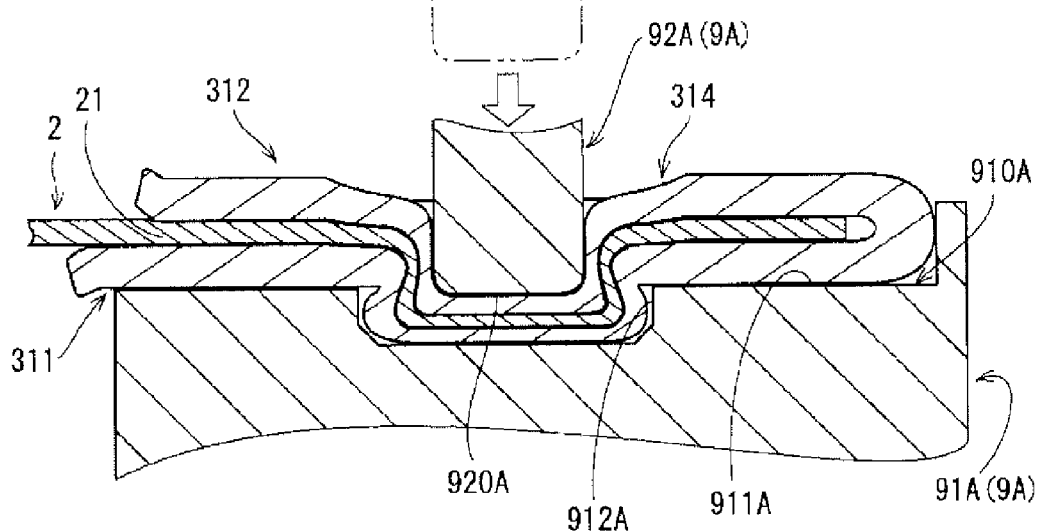
FIG. 15 is a cross-sectional view illustrating the spot compression section of the fitting-equipped electrically conductive sheet 1D during molding.

Hereinafter, a fitting-equipped electrically conductive sheet 1D according to a third embodiment will be described with reference to FIGS. 12 to 15. FIG. 12 is a plan view illustrating the fitting-equipped electrically conductive sheet 1D. FIG. 13 is a cross-sectional view illustrating a crimp section 31D of a connection fitting of the fitting-equipped electrically conductive sheet 1D. FIG. 14 is a cross-sectional view illustrating a spot compression section 315 of the connection fitting 3D of the fitting-equipped electrically conductive sheet 1D. FIG. 15 is a cross-sectional view illustrating the spot compression section 315 of the fitting-equipped electrically conductive sheet 1D during molding.

In FIGS. 12 to 15, the same reference numerals are given to the same constituent components as the constituent components shown in FIGS. 1 to 11. The fitting-equipped electrically conductive sheet 1D is an application example of the fitting-equipped electrically conductive sheet 1A according to the second embodiment. The following will describe differences of the fitting-equipped electrically conductive sheet 1D from the fitting-equipped electrically conductive sheet 1A.

Similarly to the fitting-equipped electrically conductive sheet 1A, the fitting-equipped electrically conductive sheet 1D serves as an electromagnetic shielding tool for shielding noise electromagnetic waves. However, the fitting-equipped electrically conductive sheet 1D does not have a structure for holding the sheet material 2 in a tubular shape. Accordingly, the fitting-equipped electrically conductive sheet 1D is arranged lateral to a not-shown wire harness, and fulfills an electromagnetic shielding function on this lateral side.

Similarly to the fitting-equipped electrically conductive sheet 1A, the fitting-equipped electrically conductive sheet 1D is provided with the electrically conductive sheet material 2, and two connection fittings 3D that are respectively crimped to the first edge section 21 and the second edge section 22 of this sheet material 2. Each connection fitting 3D has the crimp section 31D that is crimped to an edge section of the sheet material 2.

The crimp section 31D of the connection fitting 3D includes the pair of plate-shaped holding sections 311 and 312 that sandwich the edge section of the sheet material 2, and the folded-back section 313 that connects this pair of plate-shaped holding sections 311 and 312. Furthermore, one of the pair of plate-shaped holding sections 311 and 312 has the band-shaped recess 314, which is formed in the shape of a band. As shown in FIG. 13, the band-shaped recess 314 of the crimp section 31D has the same structure as that of the band-shaped recess 314 of the crimp section 31.

The crimp section 31D of the connection fitting 3D has spot compression sections 315, in addition to the above-described same structure as that of the crimp section 31 of the connection fittings 3 and 3A. As shown in FIG. 12, the spot compression sections 315 are formed locally in an intermediate region between the folded-back section 313 and the opposite edge sections 3110 and 3120 of the plate-shaped holding sections 311 and 312.

For example, as shown in FIG. 12, the spot compression sections 315 are formed in the state in which at least a part thereof overlaps the band-shaped recess 314. In the example shown in FIG. 12, the entire spot compression sections 315 are formed overlapping the band-shaped recess 314.

As shown in FIG. 14, the spot compression section 315 is more strongly compressed than surrounding parts. Furthermore, the spot compression section 315 has a protrusion 3151 on a surface on one side of the overlapping pair of plate-shaped holding sections 311 and 312 in the thickness direction, and a recess 3152 in a surface on the other side.

In the example shown in FIG. 14, the protrusion 3151 of the spot compression section 315 is formed on the outer surface of the first plate-shaped holding section 311, and the recess 3152 of the spot compression section 315 is formed on the outer surface of the second plate-shaped holding section 312. Note that it is also conceivable that the protrusion 3151 of the spot compression section 315 is formed on the outer surface of the second plate-shaped holding section 312, and the recess 3152 of the spot compression section 315 is formed on the outer surface of the first plate-shaped holding section 311.

Furthermore, in the example shown in FIG. 14, the protrusion 3151 on the surface on one side of the spot compression section 315 is formed so as to have a width that is larger in a head part 3153 on the vertex side than in a root part. In this case, the spot compression section 315 has an engagement structure in which the head part 3153, which is a part of the first plate-shaped holding section 311, and an outer bottom edge part 3154 of the recess 3152, which is a part of the second plate-shaped holding section 312 and overlaps with the head part 3153, are engaged with each other.

As shown in FIG. 15, the spot compression section 315 is formed by spot pressing using a press machine 9A on the pair of plate-shaped holding sections 311 and 312 on which the band-shaped recess 314 is formed in advance.

For example, the press machine 9A includes a support section 91A, and a press section 92A, which is supported so as to be able to get closer to and separate from the support section 91A.

The support section 91A has a support surface 910A for supporting the surface of one of the pair of plate-shaped holding sections 311 and 312. The support surface 910A includes a recess-shaped support surface 912A for supporting the part that is to be molded to the protrusion 3151 of the spot compression section 315, and a reference support surface 911A for supporting other parts.

On the other hand, the press section 92A has a protrusion-shaped shaping surface 920A that is to be pressed against the other one of the pair of plate-shaped holding sections 311 and 312. The protrusion-shaped shaping surface 920A of the press section 92A is a surface with which the recess 3152 of the spot compression section 315 is molded.

As shown in FIG. 15, by being sandwiched between the recess-shaped support surface 912A of the support section 91A and the protrusion-shaped shaping surface 920A of the press section 92A, a part of the overlapping pair of plate-shaped holding sections 311 and 312 is deformed so as to protrude to the support section 91A side, and is compressed. As a result, the spot compression section 315 is formed.

Furthermore, the outline of the recess-shaped support surface 912A is formed so as to be larger than the outline of the root part of that part of the pair of plate-shaped holding sections 311 and 312 that protrudes to the side opposite to the protrusion-shaped shaping surface 920A. Accordingly, the protrusion 3151 of the spot compression section 315 is molded such that the head part 3153 has a width larger than that of the root part.

The spot compression section 315 of the fitting-equipped electrically conductive sheet 1D is a section in which a part of one of the pair of plate-shaped holding sections 311 and 312 and a part of the other one are more firmly crimped. Accordingly, when the fitting-equipped electrically conductive sheet 1D is employed, the spot compression section 315 prevents a decrease in the holding force of the pair of plate-shaped holding sections 311 and 312 with respect to the sheet material 2 even in the case where a strong external force is applied to the connection fitting 3D, heat expansion occurs in the connection fitting 3D, and the like.

Furthermore, in the example shown in FIG. 12, the spot compression section 315 is formed overlapping the band-shaped recess 314 in which the degree of intimate contact between the pair of plate-shaped holding sections 311 and 312 is high. Accordingly, it is possible to prevent the crimped state of the band-shaped recess 314 from being loosened due to the formation of the spot compression section 315.

Furthermore, in the example shown in FIG. 14, the protrusion 3151 on the surface of one side of the spot compression section 315 is formed so as to have a width that is larger in the head part 3153 on the vertex side than in the root part. In this case, as described above, the spot compression section 315 has an engagement structure in which the head part 3153 and the outer bottom edge part 3154 that overlaps with the head part 3153 are engaged with each other. Such a spot compression section 315 reliably prevents loosening of the crimped state of the pair of plate-shaped holding sections 311 and 312, that is, a reduction in the holding force of the pair of plate-shaped holding sections 311 and 312.

Figure 16:
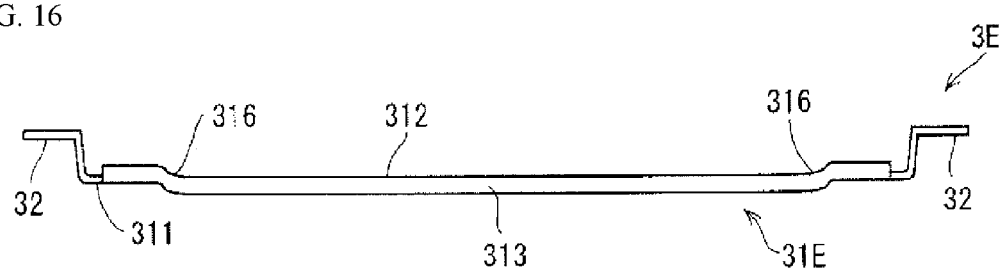
FIG. 16 is a front view illustrating a connection fitting according to a fourth application example, the connection fitting being applicable to the fitting-equipped electrically conductive sheets 1, 1A, and 1D.
Figure 17:
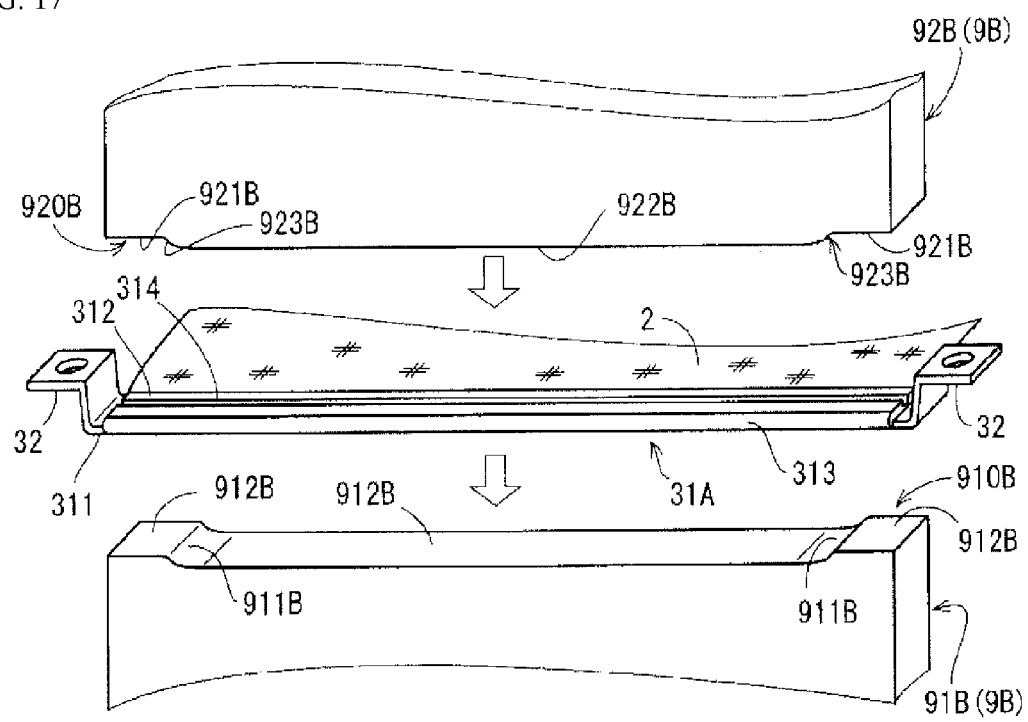
FIG. 17 is a perspective view illustrating the state in which curved sections of the connection fitting according to the fourth application example are molded.
Figure 18:
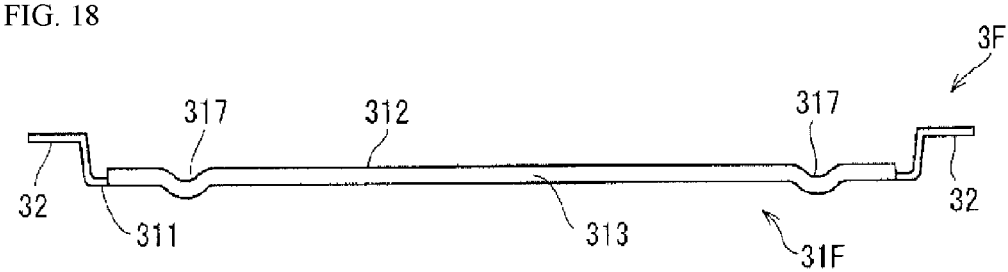
FIG. 18 is a front view illustrating a connection fitting according to a fifth application example, the connection fitting being applicable to the fitting-equipped electrically conductive sheets 1, 1A, and 1D.
Figure 19:
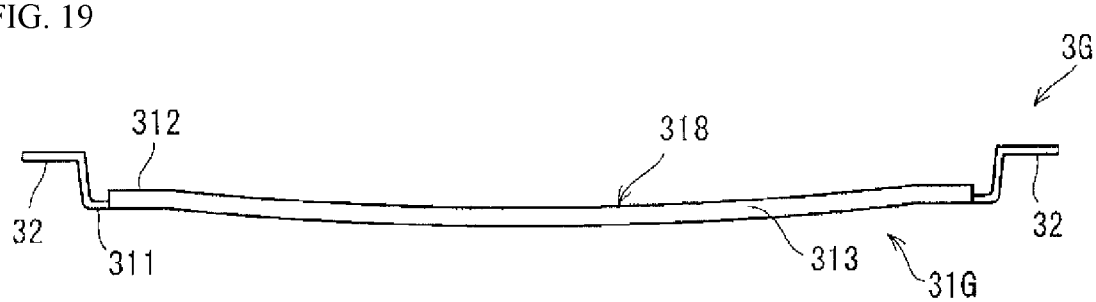
FIG. 19 is a front view illustrating a connection fitting according to a sixth application example, the connection fitting being applicable to the fitting-equipped electrically conductive sheets 1, 1A, and 1D.

Crimp Structure of Connection Fitting According to Fourth to Sixth Application Examples The following will describe crimp structures of connection fittings according to fourth to sixth application examples that are applicable to the fitting-equipped electrically conductive sheets 1, 1A, and 1D with reference to FIGS. 16 to 19. FIG. 16 is a front view illustrating a connection fitting 3E according to a fourth application example. FIG. 17 is a perspective view illustrating the state in which a curved section of the connection fitting 3E is molded. FIG. 18 is a front view illustrating a connection fitting 3F according to a fifth application example. FIG. 19 is a front view illustrating a connection fitting 3G according to a sixth application example.

In FIGS. 16 to 19, the same reference numerals are given to the same constituent components as the constituent components shown in FIGS. 1 to 15. The connection fittings 3E, 3F, and 3G are application examples of the connection fitting 3A according to the second embodiment. The following will describe differences of the connection fittings 3E, 3F, and 3G from the connection fitting 3A.

The connection fitting 3E has a crimp section 31E that is crimped to an edge section of the sheet material 2. Similarly, the connection fitting 3F has a crimp section 31F that is crimped to an edge section of the sheet material 2. Similarly, the connection fitting 3G has a crimp section 31G that is crimped to an edge section of the sheet material 2.

The crimp sections 31E, 31F, and 31G include the pair of plate-shaped holding sections 311 and 312 that sandwich the edge section of the sheet material 2, and the folded-back section 313 that connects this pair of plate-shaped holding sections 311 and 312. FIGS. 16, 18, and 19 are diagrams (front views) of the respective connection fittings 3E, 3F, and 3G viewed from the folded-back section 313 side.

Furthermore, in the crimp sections 31E, 31F, and 31G, one of the pair of plate-shaped holding sections 311 and 312 has the band-shaped recess 314 that has the same structure as that of the band-shaped recess 314 of the crimp section 31. Note that the band-shaped recess 314 is not shown in FIGS. 16, 18, and 19.

The crimp sections 31E, 31F, and 31G respectively have curved sections 316, 317, and 318 that are molded so as to be bent when viewed from the folded-back section 313 side.

The curved sections 316 of the crimp section 31E are formed so as to intersect with the crimp section 31E in a direction crossing the longitudinal direction of the band-shaped recess 314, and form steps of the crimp section 31E in the longitudinal direction of the band-shaped recess 314.

In the example shown in FIG. 16, the curved sections 316 are formed so as to intersect with the crimp section 31E in a direction orthogonal to the longitudinal direction of the band-shaped recess 314. Furthermore, in the example shown in FIG. 16, two curved sections 316 are respectively formed at two positions, namely, a position close to one end and a position close to the other end in the longitudinal direction of the band-shaped recess 314 of the crimp section 31E.

The curved sections 317 of the crimp section 31F are formed in the shape of a groove that intersects with the crimp section 31E in a direction crossing the longitudinal direction of the band-shaped recess 314.

In the example shown in FIG. 18, the curved sections 317 are formed in the shape of a groove that intersects with the crimp section 31F in a direction orthogonal to the longitudinal direction of the band-shaped recess 314. Furthermore, in the example shown in FIG. 18, two curved sections 317 are respectively formed at two positions, namely, a position close to one end and a position close to the other end in the longitudinal direction of the band-shaped recess 314 of the crimp section 31F.

The curved section 318 of the crimp section 31G is a section that is curved from a position close to one end in the longitudinal direction of the band-shaped recess 314 of the crimp section 31G to a position close to the other end.

As shown in FIG. 17, the curved sections 316 of the crimp section 31E are formed by pressing a press machine 9B on the crimp section 31A in which the band-shaped recess 314 is formed in advance.

For example, the press machine 9B includes a first die 91B, and a second die 92B, which is supported so as to be able to get closer to and separate from the first die 91B.

The first die 91B has a support surface 910B for supporting the surface of one of the pair of plate-shaped holding sections 311 and 312. The support surface 910B includes first shaping surfaces 911B for shaping the curved section 316, and a first support surface 912B for supporting the part of the crimp section other than the curved sections 316 as it is in the initial shape.

Similarly, the second die 92B has a support surface 920B for supporting the surface of the other one of the pair of plate-shaped holding sections 311 and 312. The support surface 920B includes second shaping surfaces 921B for shaping the curved section 316, and a second support surface 922B for supporting the part of the crimp section other than the curved sections 316 as it is in the initial shape.

The curved sections 316 are formed by the folded-back section 313 and the overlapping pair of plate-shaped holding sections 311 and 312 being sandwiched between the support surface 910B of the first die 91B and the support surface 920B of the second die 92B. Note that the curved sections 317 of the crimp section 31F and the curved section 318 of the crimp section 31G are fanned in the same manner.

Similarly to the spot compression sections 315 shown in FIGS. 12 and 14, the curved sections 316, 317, and 318 of the crimp sections 31E, 31F, and 31G of the connection fittings 3E, 3F, and 3G prevent a decrease in the holding force of the pair of plate-shaped holding sections 311 and 312 with respect to the sheet material 2 due to an external force, heat expansion, or the like.

Other Application Examples

Instead of the edge sections 3110 and 3120 of the pair of plate-shaped holding sections 311 and 312 of the connection fittings 3, 3A, 3D, 3E, 3F, and 3G being warped, the edge sections 3110 and 3120 may be subjected to a chamfering process or a rounding process.

The chamfering process or rounding process for the edge sections 3110 and 3120 is performed in a range from the end surfaces of the edge sections 3110 and 3120 to the inner surface that is in contact with the sheet material 2. This chamfering process or rounding process may also prevent the sheet material 2 from being caught and broken by the edge sections 3110 and 3120 of the pair of plate-shaped holding sections 311 and 312.

Note that it is also possible to configure the fitting-equipped electrically conductive sheets according to the various preferred embodiments within the scope of the claims, by suitably combining the above-described embodiments and application examples, or suitably modifying or partially omitting the embodiments and the application examples. Furthermore, the above embodiments are merely illustrative of the inventive concept and are not intended to limit the scope thereof.

LIST OF REFERENCE NUMERALS 1, 1A, 1D Fitting-equipped electrically conductive sheet
10 Wire harness
2 Sheet material
21 First edge section of sheet material
22 Second edge section of sheet material
23 Third edge section of sheet material
24 Fourth edge section of sheet material
25 Intermediate section of sheet material
3, 3A, 3D, 3E, 3F, 3G Connection fitting
3x Pre-crimp fitting
31, 31A, 31B, 31C, 31D, 31E, 31F, 31G, 31x Crimp section
311, 311x First plate-shaped holding section
3110, 3110x Edge section of first plate-shaped holding section
312, 312x Second plate-shaped holding section
3120, 3120x Edge section of second plate-shaped holding section
313 Folded-back section
313x Curved section
314, 314A, 314B Band-shaped recess 3141, 3141A, 3141B Band-shaped inclined surface
3142 Band-shaped flat surface
3143, 3143B Section having band-shaped inclined surface
3144 Bottom part
315 Spot compression section
3151 Protrusion of spot compression section
3152 Recess of spot compression section
3153 Head part of spot compression section (part of protrusion on vertex side rather than root part)
3154 Outer bottom edge part of spot compression section
316, 317, 318 Curved section of crimp section
32 Connection section
4 Screw
5 Connector-equipped electric wire group
51 Terminal-equipped electric wire
511 Terminal fitting
52 Connector
521 Electric wire holding section
522 Terminal enclosing section
53 Gasket
6 Fixing fitting
61 Opening of fixing fitting
62 Hole of fixing fitting
63 Frame of fixing fitting
64 Fixed seat of fixing fitting
7 Housing
71 Opening of housing
72 Terminal block
73 Fixed seat of housing
9 Crimping machine
9A, 9B Press machine
91 Lower die
91B First die
910 First shaping surface
910A, 910B Support surface
911A Reference support surface
911B First shaping surface
912A Recess-shaped support surface
912B First support surface
919 Groove
91A Support section
92 Upper die
92B Second die
920 Second shaping surface
920A Protrusion-shaped shaping surface
920B Support surface
921 Flat surface
921B Second shaping surface
922 Protrusion surface
9221 Side surface of protrusion surface
9222 Vertex surface protrusion surface
922B Second support surface
929 Cut-off section
92A Press section
92B Second die

The invention claimed is:
1. A fitting-equipped electrically conductive sheet comprising:
an electrically conductive sheet material; and
a connection fitting configured to electrically connect the sheet material to another member, the connection fitting including a crimp section that is formed by a plate-shaped section being folded back and that is crimped to an edge section of the sheet material,
wherein the crimp section includes:
a pair of plate-shaped holding sections between which the edge section of the sheet material is sandwiched; and
a folded-back section that connects the pair of plate-shaped holding sections,
at least one of the pair of plate-shaped holding sections has a band-shaped recess on an outer surface of an intermediate region between the folded-back section and an opposite edge section of the plate-shaped holding section, the band-shaped recess being band-shaped by being more strongly crimped to the sheet material than adjacent parts,
the band-shaped recess longitudinally extends parallel to the folded-back section,
the sheet material protrudes from the crimp section to a side that is opposite to the folded-back section, and
a connection section configured to be electrically connected to a connection target is provided on at least one side of the crimp section in a longitudinal direction of the band-shaped recess.
2. The fitting-equipped electrically conductive sheet according to claim 1, wherein a surface of the band-shaped recess includes a band-shaped inclined surface that extends in a longitudinal direction of the band-shaped recess, and is formed so as to become gradually deeper from an end of the band-shaped recess in a width direction.
3. The fitting-equipped electrically conductive sheet according to claim 2, wherein the surface of the band-shaped recess further includes a band-shaped flat surface that extends in the longitudinal direction of the band-shaped recess, and is formed at a constant depth between a pair of band-shaped inclined surfaces formed extending from two ends of the band-shaped recess in the width direction.
4. The fitting-equipped electrically conductive sheet according to claim 3, wherein the sheet material is metal cloth that has a mesh structure in which metallic yarn is crossed and woven, and
the band-shaped flat surface of the band-shaped recess is formed so as to have a width that is larger than a pitch of the metallic yarn of the metal cloth.
5. The fitting-equipped electrically conductive sheet according to claim 1, wherein the sheet material is metal cloth that has a mesh structure in which metallic yarn is crossed and woven.
6. The fitting-equipped electrically conductive sheet according to claim 1, wherein the band-shaped recess is formed along one straight line on only one of the pair of plate-shaped holding sections.
7. The fitting-equipped electrically conductive sheet according to claim 1, wherein the band-shaped recess includes:
two recesses that are formed in parallel on one of the pair of plate-shaped holding sections; and
one recess that is formed at a position on the other one of the pair of plate-shaped holding sections that is opposite to a region between the two recesses.
8. The fitting-equipped electrically conductive sheet according to claim 1, wherein the pair of plate-shaped holding sections further includes a spot compression section at a location in an intermediate region between the folded-back section and opposite edge sections of the plate-shaped holding sections, the spot compression section being more strongly compressed than surrounding parts, and having a protrusion on a surface on one side of the overlapping pair of plate-shaped holding sections in a thickness direction and a recess on a surface on the other side.

9. The fitting-equipped electrically conductive sheet according to claim 8, wherein the spot compression section is formed overlapping the band-shaped recess.

10. The fitting-equipped electrically conductive sheet according to claim 8, wherein the protrusion on the surface on one side of the spot compression section is formed so as to have a width that is larger in a part on a vertex side than in a root part.

11. The fitting-equipped electrically conductive sheet according to claim 1, wherein the crimp section has a curved section that is molded in a curved shape when viewed from the folded-back section side.

12. The fitting-equipped electrically conductive sheet according to claim 1, wherein each of the edge sections of the pair of plate-shaped holding sections that are opposite to the folded-back section is configured to warp to a side that is opposite to the sheet material side.

13. The fitting-equipped electrically conductive sheet according to claim 1,
wherein the connection part is provided with a hole.

14. The fitting-equipped electrically conductive sheet according to claim 1, wherein the band-shaped recess is formed along an entire length of at least one of the pair of plate-shaped holding sections in a longitudinal direction of the folded-back section.

\* \* \* \* \*